(12) United States Patent
Birk (10) Patent No.: US 6,188,230 B1
(45) Date of Patent: *Feb. 13, 2001

(54) PICKUP CHUCK FOR DOUBLE SIDED CONTACT

(75) Inventor: Thomas J. Birk, Gilbert, AZ (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/991,664

(22) Filed: Dec. 16, 1997

(51) Int. Cl.[7] ..................................... G01R 31/02
(52) U.S. Cl. ............................. 324/754; 324/762
(58) Field of Search ..................... 324/754, 72.5, 324/760, 762, 765, 158.1; 439/68, 71, 67, 77; 257/690, 778, 692

(56) References Cited

U.S. PATENT DOCUMENTS

| 5,006,792 | * | 4/1991 | Malhi et al. ........................ 324/762 |
| 5,049,813 | * | 9/1991 | Van Loan et al. .................. 324/754 |
| 5,309,324 | * | 5/1994 | Herandez et al. .................. 361/734 |
| 5,367,253 | * | 11/1994 | Wood et al. ..................... 324/158.1 |
| 5,435,733 | * | 7/1995 | Chernicky et al. .................. 439/68 |
| 6,054,757 | * | 4/2000 | Kobayashi ......................... 257/690 |

\* cited by examiner

*Primary Examiner*—Safet Metjahic
*Assistant Examiner*—Minh Tang
(74) *Attorney, Agent, or Firm*—Blakely, Sokoloff, Taylor & Zafman LLP (57) ABSTRACT

A pickup chuck for retaining a semiconductor chip package having electrical contact pads on a surface thereof facing into the pickup chuck. The pickup chuck includes an electrically conductive member for coupling the contact pads to an external electrical device, such as a tester.

10 Claims, 6 Drawing Sheets

PICKUP CHUCK FOR DOUBLE SIDED CONTACT

BACKGROUND OF THE INVENTION

1). Field of the Invention

The present invention relates generally to testing of semiconductor chip packages and, more specifically, to a pickup chuck which is used in combination with a contactor for purposes of testing a semiconductor chip package, and to a method of making electrical contact between a semiconductor chip package and a contactor.

2). Discussion of Related Art

Figure 1:
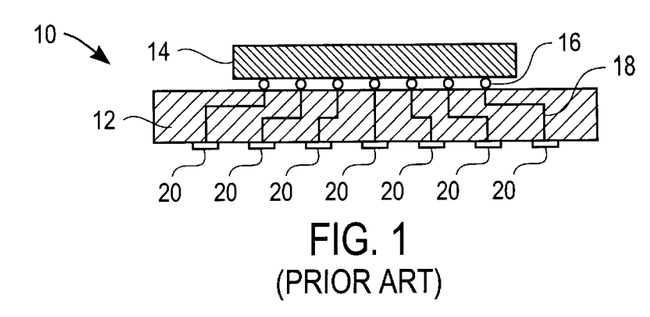
FIG. 1 is a sectioned side view of a conventional semiconductor chip package.

FIG. 1 of the accompanying drawings shows a conventional semiconductor chip package 10 comprising a package substrate 12 and a semiconductor chip 14 located on the package substrate 12. An integrated circuit is located within the semiconductor chip 14. The integrated circuit is placed in electrical communication with the package substrate 12 via an array of solder balls 16. Electrical leads 18 lead through the package substrate 12 to a set of contact pads 20 on an opposing surface of the package substrate 12. A semiconductor chip such as the semiconductor chip 14 of FIG. 1 is usually tested after being located on the package substrate 12 and before being shipped out.

Figure 2:
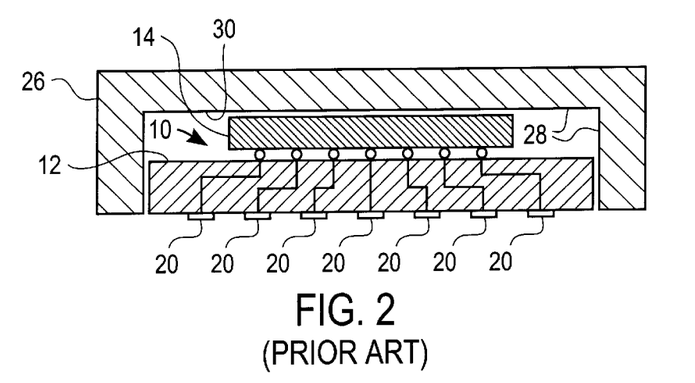
FIG. 2 is a sectioned side view of a conventional pickup chuck which is used for picking up the semiconductor chip package of FIG. 1.

FIG. 2 illustrates diagramatically a portion of a conventional pickup chuck 26, for purposes of picking up a semiconductor chip package 10 such as in FIG. 1, defining a recess 28. The pickup chuck is positioned over the semiconductor chip package 10 with the semiconductor chip package 10 located within the recess 28 and seating on an inner surface 30 of the recess 28. Suction pads or the like (not shown), are then operated so as to retain the semiconductor chip package 10 within the recess 28. Utilizing the pickup chuck 26, the semiconductor chip package 10 is then transported to a contactor which is electrically connected to an electrical test unit.

Figure 3:
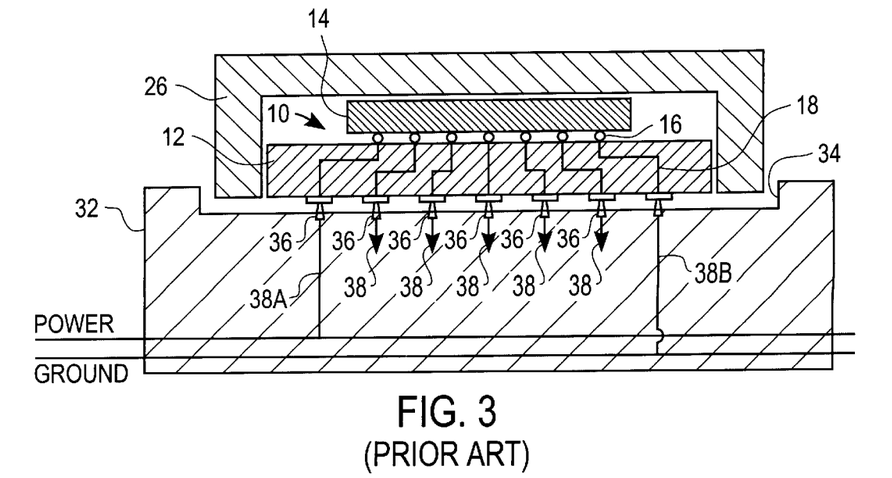
FIG. 3 is a sectioned side view of the pickup chuck of FIG. 2 used in combination with a conventional contactor.

FIG. 3 illustrates the pickup chuck 26 which is used in combination with a contactor 32 for purposes of electrically connecting the contact pads 20 to the electric test unit. The contactor 32 has a locating formation 34 therein which receives the pickup chuck 26, and a set of pogo pins 36, located within the locating formation 34, each of which making contact with a respective contact pad 20. Electrical leads 38 extend from the pogo pins 36 and eventually end up within the electric test unit. The semiconductor chip 14 is thus electrically connected to the test unit via the array of solder balls 16, the electric leads 18, the contact pads 20, the pogo pins 36, and the electric leads 38. Two of the electric leads 38A and 38B are respectively connected to a power source and electric ground for purposes of supplying electric power to the semiconductor chip 14 and supplying the semiconductor chip 14 with electric ground. Note that the electric power and electric ground are supplied to the semiconductor chip package 10 via two of the contact pads 20, all of the contact pads being located on a single surface of the package substrate 12.

Figure 4:
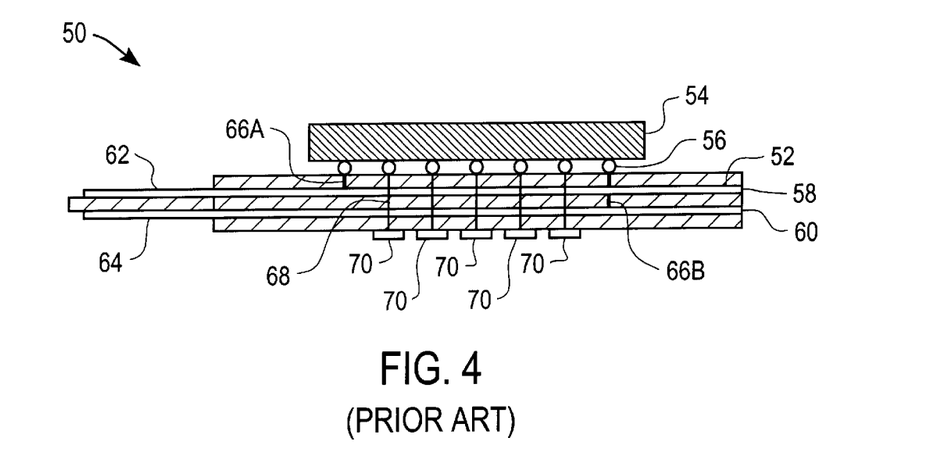
FIG. 4 is sectioned side view of one semiconductor chip package having contacts on opposing surfaces.

FIG. 4 illustrates recent developments in the technology of Intel Corporation of Santa Clara, Calif. wherein electric contacts are provided on opposing surfaces of the package substrate. FIG. 4 shows a semiconductor chip package 50 which includes a package substrate 52 and a semiconductor chip 54 located on the package substrate 52. Electric connection between an integrated circuit within the semiconductor chip 54 and the package substrate 52 is made via an array of solder balls 56. The package substrate 52 is made in layers which include a first metal layer 58 and a second metal layer 60. The first and second metal layers 58 and 60 each has a exposed region at the end of the package substrate 52. The exposed regions are positioned so as to form a first electric contact 62 on a chip side of the package substrate 52 and a second electric contact 64 on a non-chip side of the package substrate 52. First and second electric leads 66A and 66B connect the semiconductor chip 54 electrically to respectively the first metal layer 58 and the second metal layer 60. Electric power is supplied to the semiconductor chip 54 by application of a power source to the first electric contact 62, and electric ground is supplied to the semiconductor chip 54 by application of electric ground to the second electrical contact 64. More electric leads 68 extend through the package substrate 52 to contact pads 70 on the non-chip side of the package substrate 52. The contact pads 70 serve to provide logic communication to the semiconductor chip 54.

It can thus be seen that the semiconductor chip package 50 has electric contacts on opposing sides thereof, as opposed to the semiconductor chip package 10 of FIG. 1 which only has electric contact pads on one side thereof. A test arrangement is therefore required which can make contact with all contacts. Although the description that follows is primarily directed at apparatus for purposes of handling the semiconductor chip package 50 of FIG. 4, it should be understood that the invention resides in the broader concept of making electric contact with contacts on opposing sides of a semiconductor chip package, regardless of the exact positioning or purpose of the contacts.

SUMMARY OF THE INVENTION

The invention provides a pickup chuck which includes a body defining a recess for receiving a semiconductor chip package, and an electrically conductive element mounted within the recess. The electrically conductive element comprises a first portion contacting an electrical contact on the semiconductor chip package facing into the recess, and a second portion extending from the first portion past an edge of the semiconductor chip package in a direction which is out of the recess.

BRIEF DESCRIPTION OF THE DRAWINGS

The present invention is illustrated by way of example and not limitation in the figures in the accompanying drawings in which.

DETAILED DESCRIPTION OF THE INVENTION

In the following description, for purposes of explanation, numerous specific details are set forth in order to provide a thorough understanding of the present invention. It will be evident, however, to one skilled in the art that the present invention may be practiced without these specific details. In other instances well known testing methods and apparatuses have not been described in detail in order to not obscure the present invention.

Figure 5:
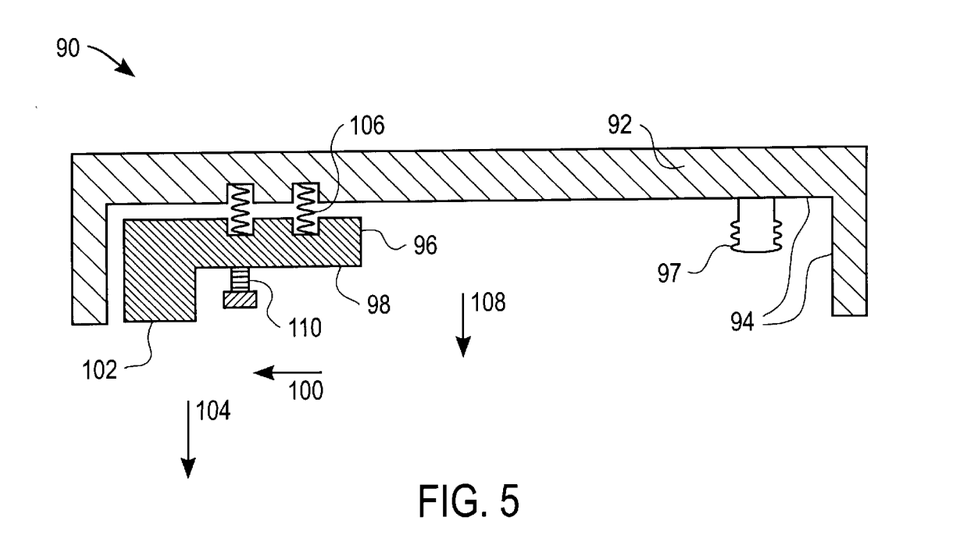
FIG. 5 is sectioned side view illustrating a pickup chuck according to one embodiment of the invention.

FIG. 5 of the accompanying drawings illustrates a pickup chuck 90, according to the invention, which includes a body 92 defining a recess 94, an L-shaped electrically conductive element 96 and a suction pad 97 mounted within recess 94.

The element 96 comprises a first portion 98 extending in a direction 100 which is towards a periphery of the recess 94, and a second portion 102 extending from the first portion 98 in a direction 104 which is outwardly from the recess 94. The element 96 is mounted to the body 92 by a set of springs 106 which bias the element 96 in a direction 108 which is outwardly from the recess 94. A capacitor 110 is electrically connected to the first portion 98 and is fixed thereto.

Figure 6:
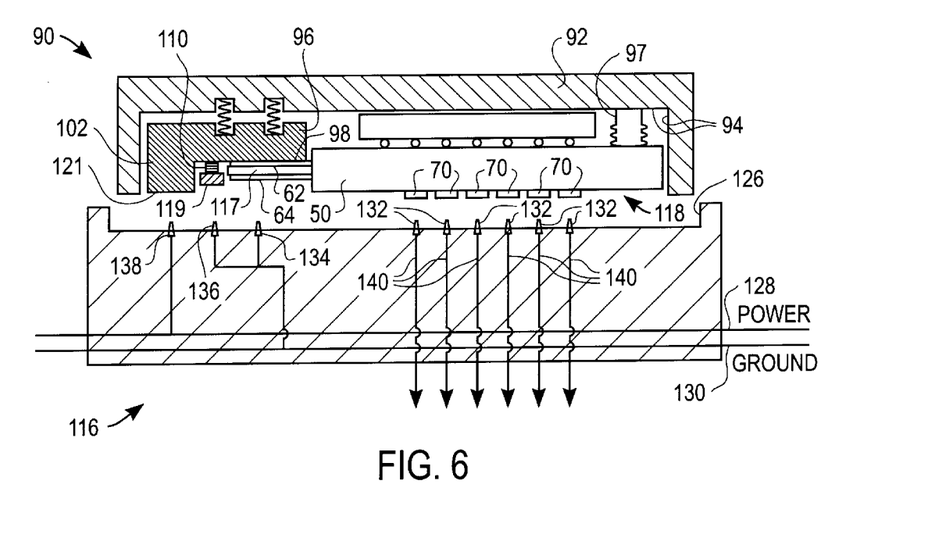
FIG. 6 is a sectioned side view of a contactor and the pickup chuck of FIG. 5 which is used for picking up a semiconductor chip package of the kind shown in FIG. 4.

FIG. 6 illustrates a tester combination, including the pickup chuck 90 of FIG. 5 and a contactor 116.

The pickup chuck 90 is shown after picking up a semiconductor chip package 50 of the kind shown in FIG. 4 with the suction pad 97 engaging the semiconductor chip package 50, retaining the semiconductor chip package 50 within the recess 94. The recess 94 is deep and wide enough to accommodate the semiconductor chip package 50 and is shaped to receive the semiconductor chip package 50 with the first electric contact 62 facing into the recess 94 and touching the first portion 98 of the electrically conductive element 96. The semiconductor chip package 50 thus seats on an inner surface of the recess 94 and on the first portion 98 of the element 96. The second portion 102 extends from the first portion 98 past an edge of the semiconductor chip package 50. An exposed side 118 of the pickup chuck 90 and the semiconductor chip package 50 thus have a number of contacts exposed to the contactor 116, including the contact pads 70, the second electrical contact 64, a contact 119 on the capacitor 110, and a surface 121 of the second portion 102 of the electrically conductive element 96.

The contactor 116 is formed with a locating formation 126, a number of pogo pins on a surface within the locating information 126, and a number of electrical leads connected to the pogo pins, including a power supply lead 128 and an electrical ground lead 130. A number of the pogo pins 132 are aligned with the contact pads 70. A pogo pin 134 is aligned with the second electrical contact 64. A pogo pin 136 is aligned with the contact 119 on the capacitor 110. A pogo pin 138 is aligned with the surface 121 of the second portion 102 of the electrically conductive element 96. The pogo pins 132 are connected via electrical leads 140 to an electrical test unit. The pogo pins 134 and 136 are connected to the electric ground 130. The pogo pin 138 is connected to the power supply 128.

Figure 7:
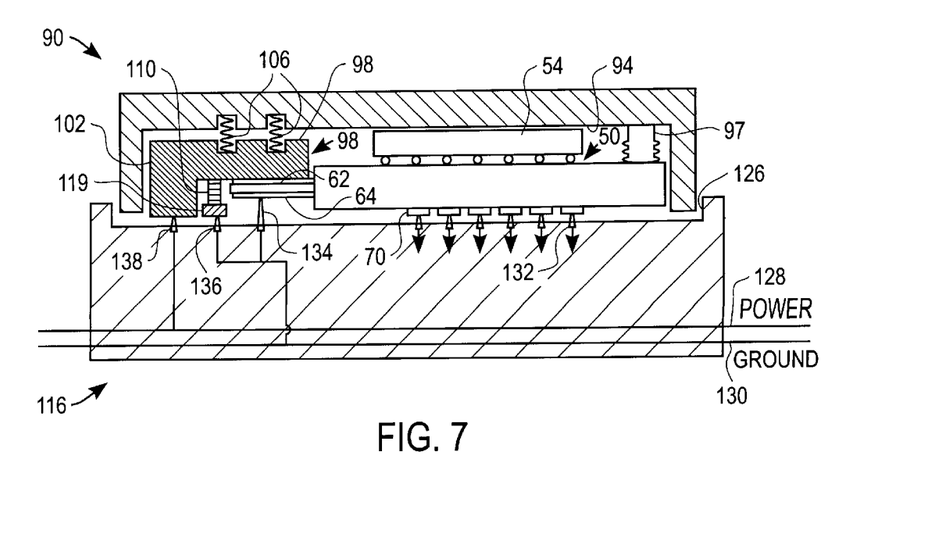
FIG. 7 is a sectioned side view, similar to FIG. 6, illustrating the pickup chuck after engagement with the contactor.

FIG. 7 illustrates the tester combination of FIG. 6 after the pickup chuck 90 is moved towards the contactor 116, and until the pickup chuck 90 engages within the locating formation 126. The movement of the pickup chuck 90 towards the contactor 116 causes the pogo pins 132 to contact the contact pads 70, the pogo pin 134 to contact the second electrical contact 64, the pogo pin 136 to contact the contact 119 on the capacitor 110, and the pogo pin 138 to contact the surface 121 of the second portion 102 of the electrically conductive element 96. The second electrical contact 64, and therefore the semiconductor chip 54, is thus connected to electric ground 130 and the first electric contact 62, facing into the recess 94, is connected to the power supply 128 via the electrically conductive element 96. Electric power and ground is thus established with the semiconductor chip 54.

Positive engagement of the electrically conductive element 96, the semiconductor chip package 50, and the pogo pins relatively to one another is allowed for by compression of the springs 106.

It is known than a certain inductance exists between the first electrical contact 62 and the second electrical contact 64. High inductance is undesirable when alternating power is supplied to the contacts 62 and 64. The inductance can be reduced by bridging the contacts 62 and 64 with a capacitor. The closer the capacitor is in the electric circuit to the contacts 62 and 64, the more the inductance will be reduced. For this reason the capacitor 110 is located on the first portion 98, so as to be as close as possible to the first electric contact 62, and is connected to the second electric contact 64 via the pogo pins 136 and 134. By positioning of the capacitor 110 in the position shown, the inductance can generally be reduced to below 0.3 nH.

Thus, a tester combination, a pickup chuck, and a method of making electrical contact between a semiconductor chip package and a contactor have been described. Although the present invention has been described with reference to specific exemplary embodiments, it will be evident that various modifications may be made to these embodiments without the departing from the broader spirit and scope of the invention.

Figure 8:
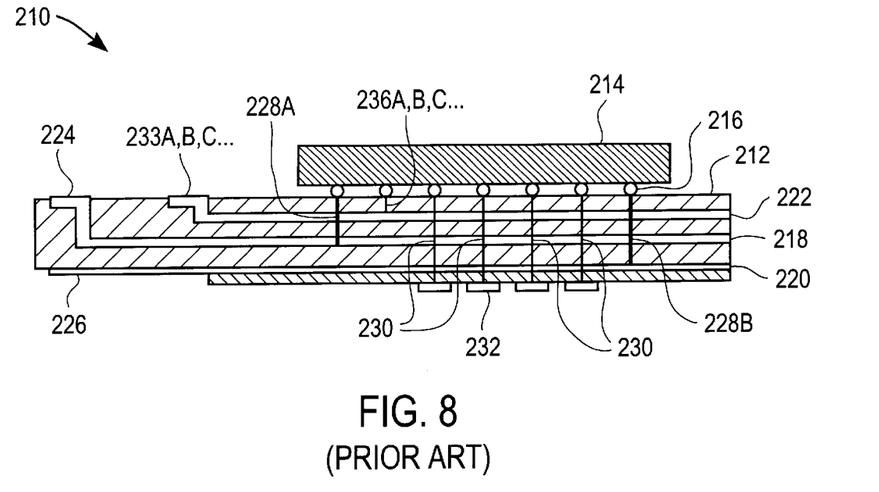
FIG. 8 is a sectioned side view of another semiconductor chip package.
Figure 9:
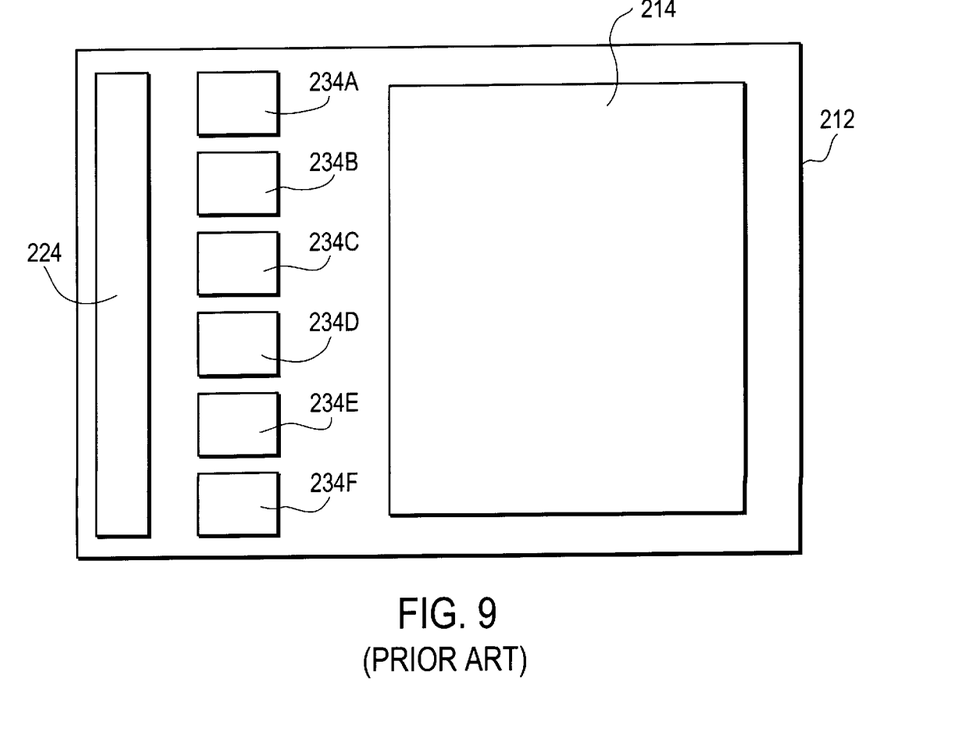
FIG. 9 is a plan view of the semiconductor chip package of FIG. 8.
Figure 10:
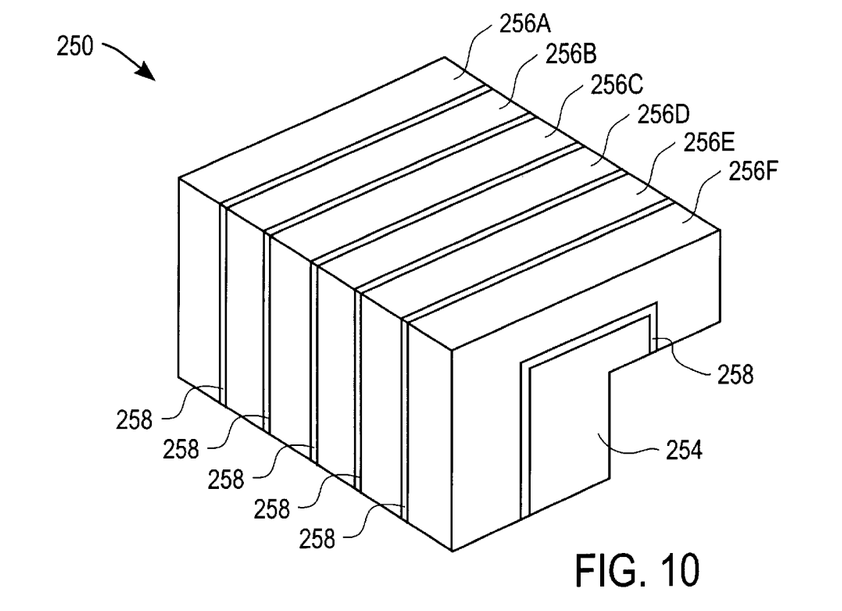
FIG. 10 is a perspective view from above of a conductive element for purposes of making contact with the semiconductor chip package of FIG. 9.
Figure 11:
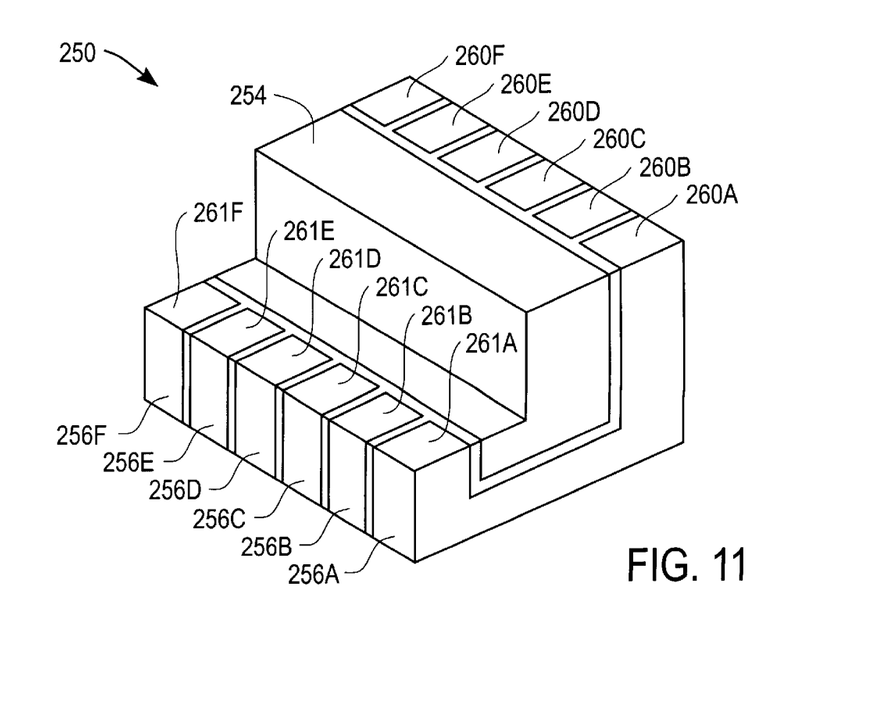
FIG. 11 is a perspective view from below of the element of FIG. 10.
Figure 12:
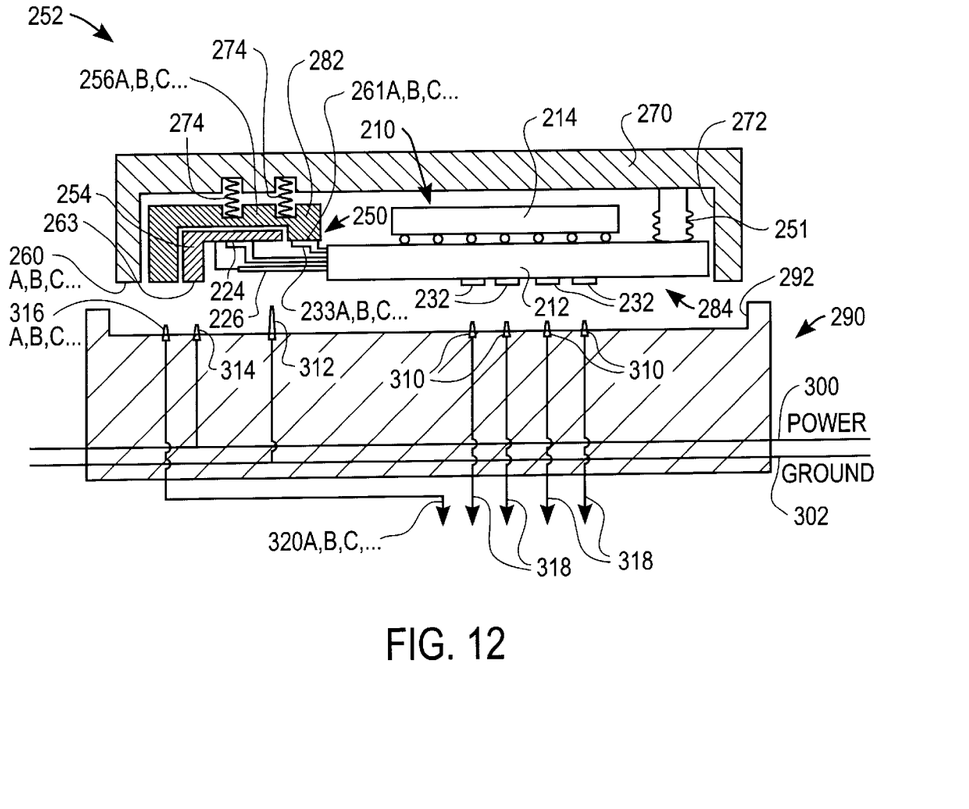
FIG. 12 is a sectioned side view of another contactor and a pickup chuck incorporating the element of FIGS. 10 and 11.

For example, FIGS. 8 and 9 illustrate another semiconductor chip package 210 and FIGS. 10–12 illustrate apparatus for use in handling the semiconductor chip package 210.

The semiconductor chip package 210 includes a package substrate 212 and a semiconductor chip 214 located on the package substrate 212. Electric connection between an integrated circuit located in the semiconductor chip 214 and the package substrate 212 is made via an array of solder balls 216. The package substrate 212 is made in layers which includes a first metal layer 218, a second metal layer 220, and a third layer of metal 222. The first and second metal layers 218 and 220 each has an exposed region at an end of the package substrate 212. The exposed regions are positioned so as to form a first electric contact 224 on a chip side of the package substrate 212 and a second electric contact 226 on non-chip side of the package substrate 212. First and second electric leads, 228A and 228B respectively, connect the semiconductor chip 214 electrically to respectively the first metal layer 218 and the second metal layer 220. Electric power is supplied to the semiconductor chip 214 by application of a power source to the first electric contact 224, and electric ground is supplied to the semiconductor chip 214 by application of electric ground to the second electric contact 226. More electric leads 230 extend through the package substrate 212 to contact pads 232 on the non-chip side of the package substrate 212. The contact pads 232 serve to provide logic communication to the semiconductor chip 214.

The third layer of metal 222 is formed in strips which terminate in a set of contact pads 233A,B,C . . . A number of the solder balls, which in FIG. 8 are located behind or in another, are each connected to a respective strip of the third layer of metal 222 by means of respective electric leads 236A,B,C . . . Each solder ball can therefore be independently accessed by making contact to a respective contact pad 233A,B,C . . . of the set of contact pads. The semiconductor chip package 212 thus has more than one electric contact on the chip side thereof, and more electric contacts on the non-chip side thereof.

FIGS. 10 and 11 illustrate an electrically conductive element 250 which is used in a pickup chuck 252 which is shown in FIG. 12.

The electrically conductive element 250 comprises a first conductive component 254 and a set of second conductive components 256A,B,C . . . The first conductive component 254 is in an L shape which extends the entire width of the electrically conductive element 250. The second conductive components 256A,B,C . . . each curls around an outer surface of the L shaped first conductive component 254. The first conductive component 254 is insulated from the second conductive components 256A,B,C, . . . , and the second conductive components 256A,B,C . . . are each insulated from one another, by means of insulating material 258. Referring specifically to FIG. 11, each conductive component 256A,B,C . . . has terminating contact pads 260A,B,C . . . and 261A,B,C . . . respectively on opposing sides of the first conductive component 254.

The pickup chuck 252, shown in FIG. 12, includes a body 270 defining a recess 272 with the electrically conductive element 250 and a suction pad 251 mounted within the recess 272. The electrically conductive element 250 is mounted to the body 270 by a set of springs 274 which bias the electrically conductive element 250 in a direction which is outwardly from the recess. The semiconductor chip package 210 is retained within the recess 272 and seats on an inner surface of the recess 272 and on a first portion 282 of the electrically conductive element 250. The terminating contact pads 261A,B,C . . . each contacts a respective contact pad 233A,B,C . . . of the set of contact pads, and the first conductive component 254 contacts the first electric contact 224. An exposed side 284 of the pickup chuck 252 and the semiconductor chip package 210 thus have a number of contacts exposed, including the terminating contact pads 260A,B,C . . . , a surface 263 of the first conductive component 254, the second electric contact 226, and the contact pads 232.

FIG. 12 also shows a contactor 290 which is used in combination with a pickup chuck 252. The contactor 290 is formed with a locating formation 292, a number of pogo pins on the surface within the locating formation 292, and a number of electrical leads connected to the pogo pins, including a power supply lead 300 and electrical ground lead 302. A number of the pogo pins 310 are aligned with the contact pads 232. A pogo pin 312 is aligned with a second electrical contact 226. A pogo pin 314 is aligned with the surface 26 of the first conductive component 254. A row of pogo pins 316A,B,C . . . are aligned with the respective terminating contact pads 260A,B,C . . . of the second conductive components 256A,B,C . . . The pogo pin 312 is connected to the electric ground line 302. The pogo pin 314 is connected to the power supply line 300. The pogo pins 310 are connected via electrical leads 318 to an electrical test unit. Each of the pogo pins 316A,B,C . . . is also connected via a respective electrical lead 320A,B,C . . . to the electrical test unit. The strips of the third layer of metal 222 can thus be individually accessed through the respective electrical leads 320A,B,C . . . and may, for example, be used to provide logic communication with the semiconductor chip 214. Such logic communication may, for example, include communication, between the electrical test unit and the semiconductor chip 210, of the electrical power required by the semiconductor chip 210.

The embodiment of FIGS. 10–12 may be provided with a capacitor, such as in the embodiment of FIGS. 5–7, and other modifications are possible without departing from the broader spirit of the invention. Accordingly, the specification and drawings should be regarded in an illustrative rather than a restrictive sense.

Although the two embodiments described above each utilizes an electrically conductive element on the pickup chuck, an embodiment may also be possible wherein the electrically conductive element is located on a contactor, or wherein the electrically conductive element is separate from either a pickup chuck and a contactor.

Electric connection in the two embodiments described, is made by movement of the pickup chuck towards the contactor. An embodiment may also be possible wherein electric contact with an electrically conductive element is made following engagement of a pickup chuck with a contactor.

What is claimed:

1. A tester combination which includes:

a pickup chuck defining a recess for receiving a semiconductor chip package, the semiconductor chip package comprising a first electrical contact on a surface thereof, the first electrical contact having a surface facing away from the recess; and a second electrical contact on a surface thereof, the second electrical contact having a surface facing into the recess;

a contactor, which is disengageable from and engageable with the pickup chuck, having a third electrical contact and a fourth electrical contact positioned so that, when the contactor is engaged with the pickup chuck, the third and fourth electrical contacts are located on a side of the semiconductor chip package opposing the surface of the second electrical contact; and an electrically conductive element, wherein the surface of the first and third electrical contacts contact one another, and the element electrically connects the surface of the second and fourth electrical contacts with one another when the pickup chuck and the contactor are engaged with one another.

2. The tester combination of claim 1 wherein movement of the pickup chuck and the contactor relative to one another from disengagement of the pickup chuck and the contactor from one another to engagement of the pickup chuck and the contactor with one another causes the surface of the first and third electrical contacts to contact one another, and the element to electrically connect the surface of the second and fourth electrical contacts with one another.

3. The tester combination of claim 1 wherein the element is mounted to the pickup chuck.

4. The tester combination of claim 1 which includes a capacitor electrically connected between the element and the third electrical contact.

5. The tester combination of claim 4 wherein the capacitor is secured to the element.

6. The tester combination of claim 1 wherein contact surfaces of the third and fourth electrical contacts face in the same direction.

7. The tester combination of claim 1 wherein contact surfaces of the third and fourth electrical contacts are substantially in the same plane.

8. The tester combination of claim 1 which includes a biasing device which biases the element against the second electrical contact.

9. The tester combination of claim 1 wherein the element comprises:
   - a first portion making contact with the second electrical contact; and
   - a second portion extending from the first portion past an edge of the semiconductor chip package.

10. A tester combination which includes:
   - a pickup chuck defining a recess for receiving a semiconductor chip package, the semiconductor chip package comprising a first electrical contact on a surface thereof, the first electrical contact having a surface facing away from the recess, and a second electrical contact on a surface thereof, the second electrical contact having a surface facing into the recess;
   - a contactor, which is disengageable from and engageable with the pickup chuck, having a third electrical contact and a fourth electrical contact positioned so that, when the contactor is engaged with the pickup chuck, the third and fourth electrical contacts are located on a side of the semiconductor chip package opposing the surface of the second electrical contact; and
   - an electrically conductive element, mounted to the pickup chuck such that movement of the pickup chuck and the contactor relative to one another from disengagement of the pickup chuck and the contactor from one another to engagement of the pickup chuck and the contactor with one another causes the surface of the first and third electrical contacts to contact one another, and the element to electrically connect the surface of the second and fourth electrical contacts with one another.

* * * * *